FREQUENCY MODULATOR INCLUDING TRANSISTOR MULTIVIBRATOR
Filed Aug. 1, 1962
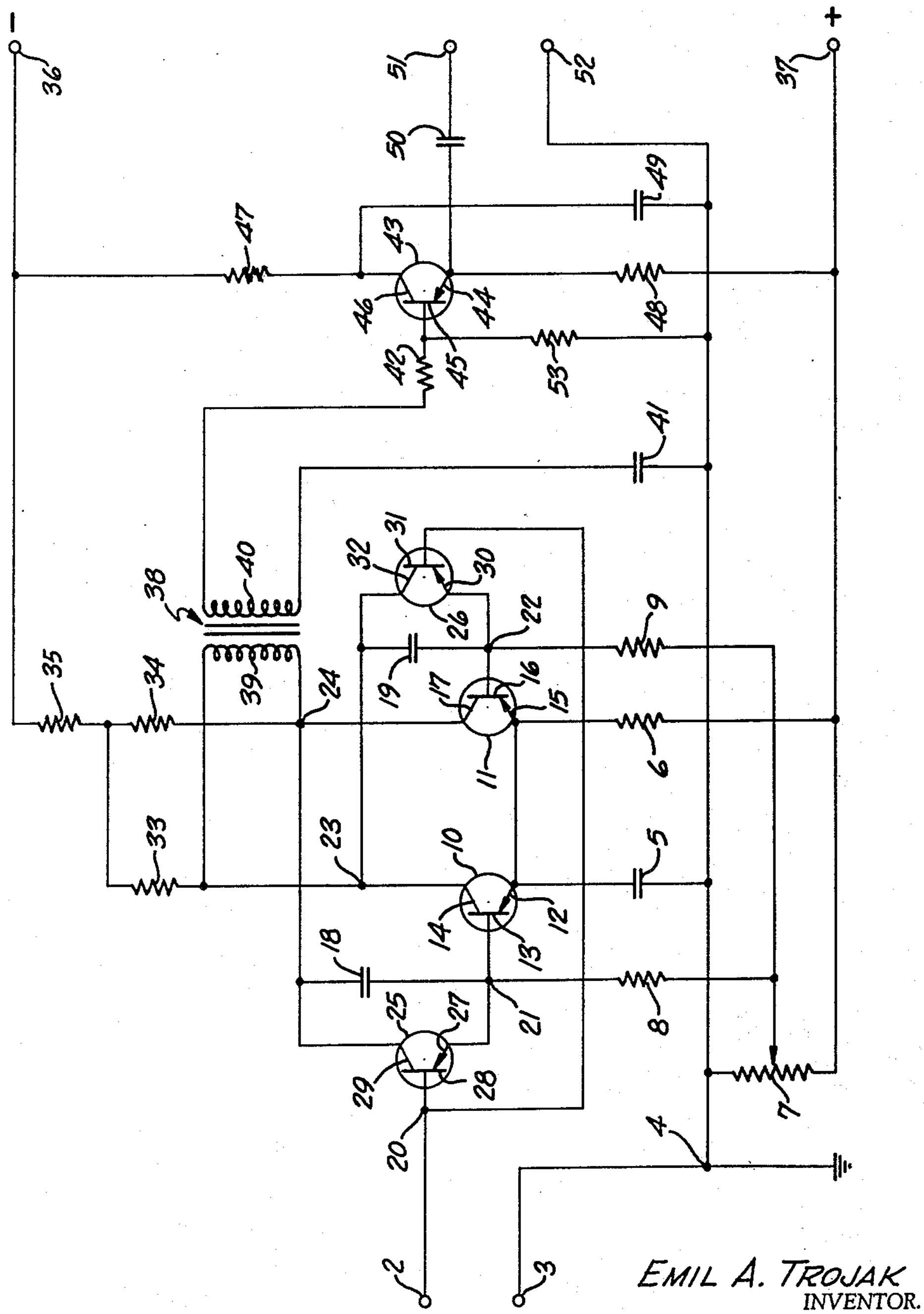
EMIL A. TROJAK
INVENTOR.
BY Robert G. Clay
ATTORNEY

United States Patent Office 3,193,782
Patented July 6, 1965

3,193,782

FREQUENCY MODULATOR INCLUDING TRANSISTOR MULTIVIBRATOR

Emil A. Trojak, Palo Alto, Calif., assignor to Ampex Corporation, Redwood City, Calif., a corporation of California Filed Aug. 1, 1962, Ser. No. 214,103
4 Claims. (Cl. 332—16)

This invention relates to frequency modulators and more particularly to frequency modulators having a minimum of modulating signal feedthrough.

For present purposes, a frequency modulator may be considered to be an oscillation generator circuit that responds to a varying amplitude input signal by changing its frequency of oscillation accordingly. An astable or free-running circuit that is arranged to operate at a frequency dependent upon an input signal amplitude has been found to provide a reliable frequency modulator for recording television signals on magnetic tape.

In prior multivibrator-type frequency modulators, a transformer has been used in the output circuit to cancel the in-phase components of an input signal feeding through multivibrator transistor to the output. However, since the multivibrator transistors alternately conduct, the signal feedthrough components of the conducting transistor have substantially larger amplitudes than those of the non-conducting transistor. Therefore, when the signal feedthrough components are applied to the opposite ends of the primary of the transformer, the in-phase components do not cancel. Thus, this type of frequency modulator has a relatively high level of signal feedthrough that limits its use.

It is, therefore, the principal aim of this invention to provide a simple and inexpensive way to overcome the disadvantages and limitations of prior multivibrator-type frequency modulators. This is accomplished by providing amplifying means connected between the input terminals and output terminals of the multivibrator circuit for supplying amplified components of the input signal to the ends of the primary of the transformer. By way of example, the amplifying means consists of a pair of PNP transistors whose collectors are cross-coupled to the respective collectors of multivibrator transistors and whose emitters are directly coupled to the respective bases of the multivibrator transistors. The PNP transistors are alternately rendered highly conducting and negligibly conducting by the alternately conducting multivibrator transistors. Therefore, two transistors, one multivibrator transistor and the highly conducting PNP transistor, are operating at the same time, the negligibly conducting PNP transistor being considered cut off for all practical purposes and the other multivibrator transistor being non-conducting. The amplified input signal components supplied by the highly conducting PNP transistor have approximately the same amplitudes as the amplified signal feedthrough components of the conducting multivibrator transistor. Therefore, when the signal feedthrough components of the multivibrator transistor and the signal components of the PNP transistor are applied to opposite ends of the primary of the transformer, the in-phase components approximately cancel. Accordingly, this unique and novel arrangement of the present invention provides a multivibrator-type frequency modulator having a low level of input signal feedthrough.

It is, therefore, the principal object of this invention to provide a simple and inexpensive way of improving prior multivibrator-type frequency modulators.

Another object of this invention is to provide a multivibrator-type frequency modulator that has low signal feedthrough.

Other objects and advantages of the invention will become apparent from the following detailed description of a preferred embodiment of the invention when taken with the drawing which shows in the sole figure a schematic diagram of the preferred embodiment of the invention.

Referring to the sole figure, a frequency modulator including an astable, or free-running multivibrator, may be frequency controlled by an input signal connected across input terminals 2 and 3. The amplifying devices, which comprise the principal operating elements in the multivibrator, are PNP conductivity type transistors 10 and 11. Transistor 10 consists of an emitter 12, a base 13 and a collector 14 while transistor 11 consists of an emitter 15, a base 16 and a collector 17. The cross-couplings, which characterize the multivibrator type of circuit, are provided by a pair of capacitors 18 and 19, each of which couples the base of one of the transistors 10 and 11 to the collector of the other. Capacitor 18 is connected between base 13 and collector 17 while capacitor 19 is connected between base 16 and collector 14. An output transformer 38 consists of a primary winding 39 and secondary winding 40 with the primary winding 39 being connected to the collectors 14 and 17 of transistors 10 and 11 at common terminals 23 and 24. Resistor 33 is connected to collector 14 of transistor 10 and resistor 34 is connected to collector 17 of transistor 11. Resistors 33 and 34 are coupled to the negative terminal of a potential source 36 through resistor 35. The emitters 12 and 15, which are connected together, are coupled to ground 4 through capacitor 5 and also coupled to the positive terminal of potential source 37 through resistor 6.

In accordance with the present invention, input signal feedthrough is reduced by connecting a pair of PNP conductivity type transistors 25 and 26 between the bases 13 and 16 and the collectors 14 and 17 of the multivibrator transistors 10 and 11. Transistor 25 consists of an emitter 27, a base 28 and a collector 29 while transistor 26 consists of an emitter 30, a base 31 and a collector 32. Collector 29 of transistor 25 is connected to collector 17 of transistor 11 at common collector terminal 24, and collector 32 of transistor 26 is connected to collector 14 of transistor 10 at common collector terminal 23. Emitter 27 of transistor 25 and the base 13 of transistor 10 are connected together at common terminal 21 while emitter 30 of transistor 26 and the base 16 of transistor 11 are connected together at common terminal 22. The transistors 25 and 26, therefore, are arranged in the circuit such that the collectors 29 and 32 are cross-coupled to the respective collectors 17 and 14 and the emitters 27 and 30 are directly coupled to the respective bases 13 and 16. Because of the direct couplings between the emitters 27 and 30 and the bases 13 and 16, the transistors 25 and 26 are alternately rendered highly conducting and negligibly conducting by the alternately conducting multivibrator transistors 10 and 11. In this regard, when transistor 10 is conducting, a relatively low impedance path to ground, compared to that through resistor 8, is established through the base-emitter circuit of transistor 10. Current flow from the emitter of transistor 25 is in turn increased by virtue of the establishment of the low impedance path through the conducting transistor 10. Conduction through the transistor 25 is correspondingly increased. At the same time, transistor 11 is non-conducting such that the only path for current flow from the emitter of transistor 26 is through the relatively high impedance of resistor 9. Conduction through transistor 26 is correspondingly limited. Accordingly, a relatively large input signal component is supplied by transistor 25 to terminal 24 while a negligible input signal component is supplied by transistor 26 to terminal 23. At the same time, the signal feedthrough components of conducting multivibrator transistor 10 are supplied to terminal 23. The signal components from transistor 25 appearing at terminal 24 have approximately the same amplitudes as the combination of the signal components from transistors 10 and 26 appearing at terminal 23. Such signal components being applied to opposite ends of the primary 39 of transformer 38, the in-phase components approximately cancel. When the multivibrator changes state, and transistor 11 conducts while transistor 10 is non-conducting, the above described situation is reversed with an analogous result of approximate cancellation of the in-phase signal components.

Bases 28 and 31 of transistors 25 and 26 are connected together at common terminal 20, which is connected to input terminal 2. A voltage divider 7 is connected between ground 4 and the positive terminal of potential source 37. The adjustable arm of voltage divider 7 is connected to common terminals 21 and 22 through resistors 8 and 9.

One end of the secondary winding 40 of transformer 38 is connected to ground 4 through capacitor 41 while the other end of the secondary 40 is connected to the base of an emitter follower PNP transistor 43 through resistor 42. Base 45 of transistor 43 is connected to ground 4 through resistor 53. The emitter follower transistor 43 converts the high impedance input at the secondary winding 40 of the transformer 38 to a low impedance output at terminals 51 and 52. Collector 46 is connected to the negative terminal of potential source 36 through resistor 47. A capacitor 49 is connected between the collector 46 and ground 4. Emitter 44 is connected to the positive terminal of potential source 37 through resistor 48. Output terminal 51 is coupled to the emitter 44 through capacitor 50. The output signal of the frequency modulator is taken across terminals 51 and 52.

In operation, the circuit generates an operating frequency determined by the time constants of the coupled passive circuits consisting of resistors 33, 34 and 35 taken together with the cross-connected capacitors 18 and 19. One of the transistors 10 and 11 of the multivibrator circuit conducts while the other is cut off. Regenerative feedback between the two transistors 10 and 11 causes them to switch states of conduction with controlled periodicity. Transistors 25 and 26 are alternately rendered highly conducting and negligibly conducting by the alternately conducting transistors 10 and 11 in the manner previously described. Transistors 25 and 26 are both continuously conducting, but the amount of conduction (relatively high or negligible) varies in accordance with the conductive or non-conductive states of the multivibrator transistors 10 and 11. The input signal across terminals 2 and 3 passes through transistors 25 and 26 to the bases 13 and 16 of transistors 10 and 11 to vary the base currents of transistors 10 and 11, which cause the instantaneous carrier frequency to change. The output signal from the multivibrator circuit appears at the collectors 14 and 17 of transistors 10 and 11. The transformer couples the output signal to the emitter follower transistor 43, which acts as an impedance converter. The frequency modulated signal appears across the output terminals 51 and 52.

Assume that multivibrator transistor 10 is conducting and multivibrator transistor 11 is cut off. Since the base 13 of transistor 10 is connected to the emitter 27 of PNP transistor 25, transistor 10 increases the conduction of transistor 25 by providing a relatively low impedance conduction path for emitter current from transistor 25 through the base-emitter circuit of conducting transistor 10. As previously mentioned, the collector 14 of transistor 10 is connected to one end of the primary winding 39 through common collector point 23 and collector 29 of transistor 25 is connected to the other end of the primary winding through common collector point 24. Components of the input signal at the input terminals 2 and 3 pass through PNP transistor 25 to the base 13 of the multivibrator transistor 10. The input signal components feed through and are amplified by the multivibrator transistor 10, and appear at the common collector point 23 or one end of primary winding 39. At the same time, components of the input signal at input terminals 2 and 3 are significantly amplified by transistor 25 and appear at the common collector point 24 or the other end of primary winding 39, while components of the input signal are negligibly amplified by transistor 26 and appear at common collector point 23, or first end of the primary winding together with the components from transistor 10. The amplified signal components supplied by the PNP transistor 25, as reduced by the components supplied by transistor 26, have approximately the same amplitudes as the amplified signal feedthrough components of multivibrator transistor 10, and therefore, when they are applied to opposite ends of the primary 39, the in-phase components approximately cancel. The operation of the frequency modulating circuit is similar when transistors 11 and 26 are conducting and transistors 10 and 25 are respectively cut off and negligibly conducting.

Thus, it is seen that this frequency modulating circuit has a minimum feedthrough of the input signal. Although the preferred embodiment has illustrated transistors 10, 11, 25 and 26 to the PNP conductivity type transistors, it is understood that NPN conductivity type transistors may also be employed with corresponding changes in potential requirements.

This frequency modulating circuit is particularly useful in minimizing feedthrough of high frequency input signals, for example, video input signals.

Although the present invention has been shown and described in terms of a preferred embodiment, changes and modifications which do not depart from the inventive concepts taught herein will suggest themselves to those skilled in the art. Such changes and modifications are deemed to fall within the scope of this invention.

What is claimed is:

1. A frequency modulating circuit comprising a source of modulating signals:

an oscillation circuit operatively coupled to the source of modulating signals and including a pair of cross-coupled amplifier devices, said amplifier devices each having at least a control electrode and an output electrode;

a transformer having a primary and a secondary with the primary of said transformer being connected across the output electrodes of said amplifier devices and the secondary being coupled to output terminals; and amplifying means including a pair of amplifier components respectively cross-coupled between the respective control electrodes and output electrodes of said amplifier devices for supplying amplified components of said modulating signals to the primary of said transformer.

2. A frequency modulating circuit comprising a source of modulating signals:

an oscillation circuit operatively coupled to the source of modulating signals and including a first pair of transistors, each of said first pair of transistors having emitter, base and collector electrodes;

a transformer having a primary and a secondary, the primary of said transformer connected across the collector electrodes of said first pair of transistors; and a second pair of transistors, each of said second pair of transistors having emitter, base and collector electrodes, the emitter electrodes of said second pair of transistors directly coupled to the respective base electrodes of said first pair of transistors, the collectors electrodes of said second pair of transistors cross-coupled to the respective collector electrodes of said first pair of transistors, and said second pair of transistors supplying amplified components of said modulating signals to the ends of the primary of said transformer.

3. A frequency modulating circuit comprising a source of modulating signals:

a multivibrator circuit operatively coupled to the source of modulating signals and including first and second transistors;

a transformer having a primary and a secondary; and third and fourth transistors, each of said transistors having emitter, base and collector electrodes, the primary of said transformer connected across the collector electrodes of said first and second transistors, the collector electrodes of said third and fourth transistors cross-coupled to the respective collector electrodes of said first and second transistors, the emitter electrodes of said third and fourth transistors directly coupled to the respective base electrodes of said first and second transistors, and said third and fourth transistors supplying amplified components of said modulating signals to the ends of the primary of said transformer.

4. A frequency modulating circuit for video signals comprising a source of modulating signals:

a multivibrator circuit operatively coupled to the source of modulating signals and including first and second transistors with cross-coupled capacitors, said first and second transistors each having emitter, base and collector electrodes, each of the cross-coupled capacitors connected between the collector electrode of one transistor and the base electrode of the other transistor;

a transformer having a primary and a secondary, the primary of said transformer connected across the collector electrodes of said first and second transistors;

third and fourth transistors, each of said third and fourth transistors having emitter, base and collector electrodes, the emitter electrodes of said third and fourth transistors directly coupled to the respective base electrodes of said first and second transistors, the collectors electrodes of said third and fourth transistors cross-coupled to the respective collector electrodes of said first and second transistors, said third and fourth transistors supplying amplified components of said modulating signals to the ends of the primary of said transformer; and a transistor impedance converter connected across the secondary of said transformer.

References Cited by the Examiner

UNITED STATES PATENTS

| | | | |
|---|---|---|---|
| 3,010,078 | 11/61 | Stefanov | 332—14 X |
| 3,074,020 | 1/63 | Robiequet | 331—145 X |
| 3,115,583 | 12/63 | Hinkein | 307—88.5 |

ROY LAKE, *Primary Examiner.*

ALFRED L. BRODY, *Examiner.*